US008026740B2

(12) United States Patent  (10) Patent No.: US 8,026,740 B2
Hollis  (45) Date of Patent: Sep. 27, 2011

(54) MULTI-LEVEL SIGNALING FOR LOW POWER, SHORT CHANNEL APPLICATIONS

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 740 days.

(21) Appl. No.: 12/053,265

(22) Filed: Mar. 21, 2008

(65) Prior Publication Data
US 2009/0238300 A1 Sep. 24, 2009

(51) Int. Cl.
H03K 19/00 (2006.01)
(52) U.S. Cl. ............... 326/60; 326/59; 326/87; 327/530
(58) Field of Classification Search ............ 326/83–87, 326/59–60
See application file for complete search history.

(56) References Cited

U.S. PATENT DOCUMENTS

| 3,949,242 | A | * | 4/1976 | Hirasawa et al. | ............... 326/60 |
| 4,038,564 | A | * | 7/1977 | Hakata | ............ 326/60 |
| 4,408,135 | A | * | 10/1983 | Yuyama et al. | .............. 326/60 |
| 5,382,847 | A | * | 1/1995 | Yasuda | ............ 326/68 |
| 5,745,003 | A | * | 4/1998 | Wakimoto et al. | ............ 327/382 |
| 6,140,841 | A |  | 10/2000 | Suh |  |
| 6,292,014 | B1 |  | 9/2001 | Hedberg |  |
| 6,339,622 | B1 |  | 1/2002 | Kim |  |
| 6,646,472 | B1 | * | 11/2003 | Trivedi et al. | ................ 326/93 |
| 6,772,351 | B1 |  | 8/2004 | Werner et al. |  |
| 6,794,899 | B2 |  | 9/2004 | Lee et al. |  |
| 7,053,655 | B2 |  | 5/2006 | Brox |  |
| 7,072,415 | B2 |  | 7/2006 | Zerbe et al. |  |
| 7,206,876 | B2 | * | 4/2007 | Jang | .............. 710/66 |

OTHER PUBLICATIONS

Farzan et al., "A CMOS 10-Gb/s power-efficient 4-PAM transmitter," *IEEE Journal of Solid-State Circuits*, vol. 39, No. 3, pp. 529-532 (Mar. 2004).
Farjad-Rad et al., "An equalization scheme for 10Gb/s 4-PAM signaling over long cables," *Center for Integrated System, Stanford University, Mixed Signal Conference*, Jul. 1997, Cancun, Mexico, 4 pages.
Farjad-Rad et al., "A 0.4 μm CMOS 10-Gb/s 4-PAM pre-emphasis serial link transmitter," *IEEE VLSI Symposium* 1998, 2 pages.
Zerbe et al.,"1.6 Gb/s/pin 4-PAM signaling and circuits for a multi-drop bus," *Symposium on VLSI Circuits Digest of Technical Papers*, vol. 10, No. 2, pp. 128-131 (2000).
Zerbe et al., "Equalization and Clock Recovery for a 2.5—10Gb/s 2-PAM/4-PAM/ backplane transceiver cell," *IEEE International Solid-State Circuits Conference*, ISSCC 2003 / Session 4 / Clock Recovery and Backplane transceivers / Paper 4.6 (2003).

* cited by examiner

*Primary Examiner* — Vibol Tan
(74) *Attorney, Agent, or Firm* — Knobbe, Martens, Olson & Bear, LLP

(57) ABSTRACT

Apparatus are disclosed, such as those involving a transmitter circuit that is configured to generate multi-level signals based on a plurality of data digits. One such transmitter circuit includes a signal output and an encoder configured to provide control signals based at least partially on the plurality of data digits. The transmitter circuit also includes a first set of switches configured to receive one or more of the control signals, and to selectively conduct a first or second voltage reference to the signal output. The transmitter circuit further includes first and second voltage drop circuits that provide third and fourth voltage references, respectively. The third and fourth voltage references have voltage levels between those of the first and second voltage references. The transmitter circuit also includes a second set of switches configured to receive one or more of the control signals, and selectively conduct the third or fourth voltage reference to the signal output.

25 Claims, 10 Drawing Sheets

$b_0 b_1$

11 —————————————————————— $V_{DD}$

10 —————————————————————— $V_{DD} - V_{DSTR5}$

01 —————————————————————— $V_{DSTR6}$

MULTI-LEVEL SIGNALING FOR LOW POWER, SHORT CHANNEL APPLICATIONS

BACKGROUND OF THE INVENTION

1. Field of the Invention

Embodiments of the invention relate to electronic data transmission, and more particularly, in one or more embodiments, to multi-level signaling.

2. Description of the Related Art

In electronic data transmission, signals representing electronic data are transmitted from a transmitting component to a receiving component. The electronic data typically includes data symbols such as binary digits (which are often referred to as bits), i.e., 0's and 1's. In many applications, signals having two different voltage levels representing data symbols such as 0's and 1's have been widely used for such data transmission.

In certain applications, signals having more than two levels have been used to transmit electronic data. Such a signaling scheme is generally referred to as "multi-level signaling." In a multi-level signaling scheme, the data rate can be increased without increasing the clock frequency or the number of channels. In such a scheme, transmitters generate multi-level signals, and receivers detect them, allowing multiple (k) bits to be transmitted or received as one of $2^k$ possible voltages at each clock edge or at least once per clock cycle. A multi-level signaling scheme allows two or more bits of data to be simultaneously transmitted by multiple signal levels, thereby increasing the data throughput for a given operating frequency.

In certain instances, the term "multi-level signaling" is also referred to as multi-level pulse amplitude modulation or M-PAM signaling. In such a case, the number of signal levels is indicated by a number before the acronym "PAM." For example, a PAM signaling scheme using four signal levels is represented by 4 PAM. Similarly, a PAM signaling scheme using eight signal levels is represented by 8 PAM.

FIG. 1 is a graph illustrating a conventional multi-level signaling scheme using four voltage levels, i.e., 4 PAM. The four signal levels represent two-bits $b_0 b_1$. The highest voltage level over a high reference voltage $V_{REFH}$ represents the bits "11." The second highest voltage level between the high reference voltage $V_{REFH}$ and a middle reference voltage $V_{REFM}$ (which is lower than $V_{REFH}$) represents the bits "10." The third highest voltage level between the middle reference voltage and a low reference voltage $V_{REFL}$ (which is lower than $V_{REFM}$) represents the bits "01." The lowest voltage level lower than $V_{REFL}$ represents the bits "00." The two bits are transmitted as a single multi-level symbol at every clock edge by transferring an appropriate one of the four voltage levels. Therefore, the data rate of the signaling scheme just described is twice that of a 2-PAM system.

Referring to FIG. 2, a conventional transmitter circuit 200 for generating voltage levels under a 4 PAM signaling scheme will now be described. To provide the voltage levels to transmit a 4-PAM symbol, the transmitter circuit 200 sinks a predetermined amount of current for that symbol. In particular, each symbol is associated with a distinct amount of current.

The transmitter circuit 200 includes a voltage source $V_{DD}$, a resistor R, a first transistor TR1, a second transistor TR2, a first current source CS1, a second current source CS2, a first node N1, and a signal output $V_{OUT}$. The resistor R is connected between the voltage source $V_{DD}$ and the first node N1. The first node N1 is electrically connected to the signal output $V_{OUT}$. Each of the first and second transistors TR1, TR2 is connected to the first node N1 at its source/drain. The drain/source of the first transistor TR1 is connected to the first current source CR1 which provides a current of 2I. The drain/source of the second transistor TR2 is connected to the second current source CR2 which provides a current of I.

To transmit the bits "11," the transmitter circuit 200 sinks no current by turning off both of the first and second transistors TR1, TR2, and the signal output $V_{OUT}$ is pulled up to $V_{DD}$. To transmit the bits "10," the transmitter circuit 200 sinks an amount of current I by turning on the second transistor TR2 only, thereby providing $V_{DD}$–RI at the signal output $V_{OUT}$. To transmit the bits "01," the transmitter circuit 200 sinks an amount of current 2I by turning on the first transistor TR1 only, thereby providing $V_{DD}$–2RI at the signal output $V_{OUT}$. To transmit the bits "00," the transmitter circuit 200 sinks an amount of current 3I by turning on both of the first and second transistors TR1, TR2, thereby providing $V_{DD}$–3RI at the signal output $V_{OUT}$.

In the transmitter described above, when generating three out of the four signal levels (e.g., those representing "00", "01", and "10"), power is dissipated because there is a current flow through the resistor R in the circuit. In other words, three out of four signal levels consume static power. It should be understood that the translation of the two sequential binary bits into multiple voltage levels need not follow exactly as it has been described thus far. For example, the bits "00" could be encoded as the highest voltage level, rather than as the lowest level, as has thus far been illustrated. Other alternative exist as well, including the well known gray-coding which would order the levels as follows: "00", "01", "11", and "10."

BRIEF DESCRIPTION OF THE DRAWINGS

The embodiments will be better understood from the Detailed Description of Embodiments and from the appended drawings, which are meant to illustrate and not to limit the embodiments, and wherein:

FIG. 5 is a graph illustrating a multi-level signaling scheme using the transmitter circuit of FIG. 4 according to one embodiment;

DETAILED DESCRIPTION OF EMBODIMENTS

In one embodiment, a transmitter circuit for generating a multi-level signal includes a push-pull circuit. The push-pull circuit may include a plurality of voltage drop circuits and a plurality of switches to pull up or pull down its signal output level to one of multiple voltage levels.

Figure 3A:
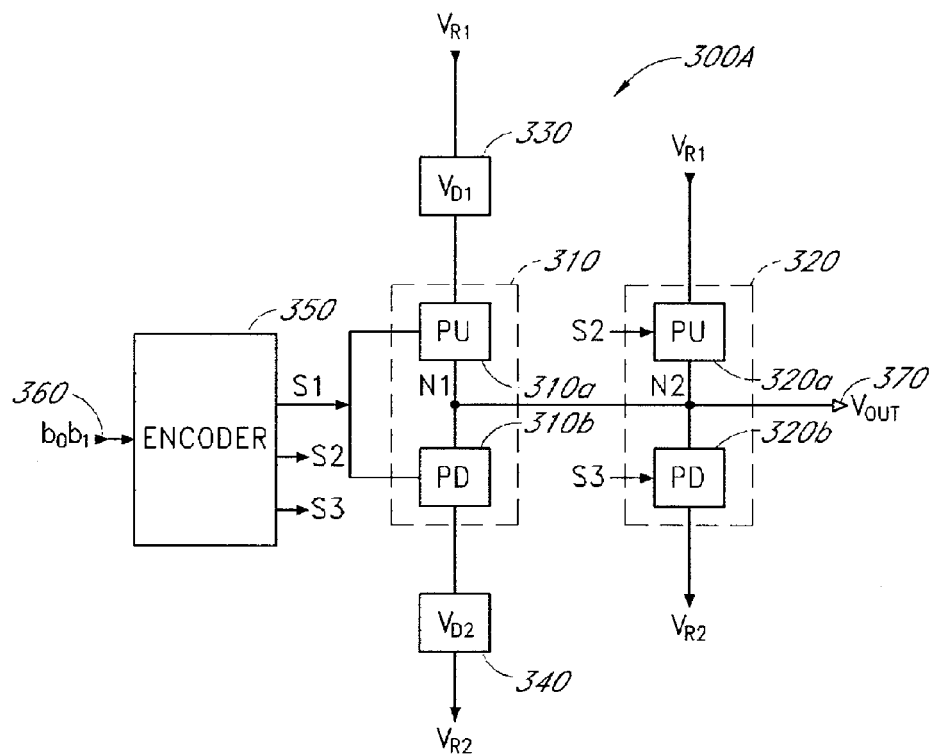
FIG. 3A is a block diagram of a transmitter circuit for generating a four-level signal according to one embodiment.

Referring to FIG. 3A, one embodiment of a transmitter circuit for multi-level signaling will now be described. The illustrated transmitter circuit 300A is configured to generate a four level voltage signal, i.e., a 4-PAM signal, based on two binary digits $b_0$ and $b_1$. The transmitter circuit 300 includes a first set of switches 310, a second set of switches 320, a first voltage drop circuit 330, a second voltage drop circuit 340, an encoder 350, a data input 360, and a signal output 370.

The first voltage drop circuit 330, the first set of switches 310, and the second voltage drop circuit 340 are connected in order between a first voltage reference $V_{R1}$ and a second voltage reference $V_{R2}$. The first set of switches 310 may include a first pull-up transistor 310a and a first pull-down transistor 310b. A first node N1 between the first pull-up transistor 310a and the first pull-down transistor 310b is electrically connected to the signal output 370. The first voltage drop circuit 330 is connected between the first voltage reference $V_{R1}$ and the first pull-up transistor 310a. The second voltage drop circuit 340 is connected between the second voltage reference $V_{R2}$ and the first pull-down transistor 310b. The first voltage reference $V_{R1}$ may be provided by a voltage source, e.g., $V_{DD}$. The second voltage reference $V_{R2}$ is lower in potential than the first voltage reference $V_{R1}$, and in one embodiment is ground.

The second set of switches 320 is connected between the first and second voltage references $V_{R1}$, $V_{R2}$. The second set of switches 320 may include a second pull-up transistor 320a and a second pull-down transistor 320b. A second node N2 between the second pull-up transistor 320a and the second pull-down transistor 320b is electrically connected to the signal output 370.

The encoder 350 receives electronic data from the data input 360, and converts it into control signals S1-S3 for selectively switching on or off the components of the first and second sets of switches 310, 320, depending on the electronic data. In the illustrated embodiment, the encoder 350 generates the control signals S1-S3 in response to two bits of electronic data at a time. The details of the control signals S1-S3 will be described below with reference to FIG. 4. In addition, further details of the voltage drop circuits and switches will be described later in connection with FIG. 4.

During operation, the transmitter circuit 300A may generate a signal having one of four voltage levels V1, V2, V3, and V4 (V1>V2>V3>V4). In one embodiment, each of V1, V2, V3, and V4 may each represent two-bits: 11, 10, 01 and 00, respectively. For example, when the bits 11 are provided to the data input 360 (e.g., two signals are received at the data input, each being at one of two possible levels), the encoder 350 generates control signals such that the second set of switches 320 pulls up the signal output 370 to the first reference voltage $V_{R1}$, which corresponds to V1. When the bits 00 are provided to the data input 360, the encoder 350 generates control signals such that the second set of switches 320 pulls down the signal output 370 to the second reference voltage $V_{R2}$, which corresponds to V4.

In an alternative embodiment, the first set of switches 310 are also configured to pull up or down with the second set of switches 320 to aid in reaching the full voltage levels. This configuration allows the second set of switches 320 to be smaller, thereby reducing the output capacitance of the circuit, which is important at high speeds.

When the bits 10 or 01 are provided to the data input 360, the encoder 350 generates control signals such that the second set of switches 320 electrically disconnects the signal output 370 from the first and second reference voltages $V_{R1}$, $V_{R2}$. When the bits 10 are provided to the data input 360, the first set of switches 310 electrically connects the first voltage drop circuit 330 to the signal output 370, and electrically disconnects the second voltage drop circuit 340 from the signal output 370. This configuration provides a voltage level of the first reference voltage $V_{R1}$ less a first voltage difference $V_{D1}$ across the first voltage drop circuit 330 ($V_{R1}-V_{D1}$) at the signal output 370.

On the other hand, when the bits 01 are provided to the data input 360, the first set of switches 310 electrically connects the second voltage drop circuit 340 to the signal output 370, and electrically disconnects the first voltage drop circuit 330 from the signal output 370. This configuration provides a voltage level of the second reference voltage $V_{R2}$ plus a second voltage difference $V_{D2}$ across the second voltage drop circuit 340 ($V_{R2}+V_{D2}$) at the signal output 370. In the illustrated embodiment, $V_{R1}-V_{D1}$ is greater than $V_{R2}+V_{D2}$. In some embodiments, $V_{D1}$ is the same as $V_{D2}$. The aforementioned signal levels representing the bits 11, 10, 01, and 00 are summarized in Table 1 below.

TABLE 1

| $b_0$ | b1 | $V_{OUT}$ |
|---|---|---|
| 1 | 1 | $V_{R1}$ |
| 1 | 0 | $V_{R1} - V_{D1}$ |
| 0 | 1 | $V_{R2} + V_{D1}$ |
| 0 | 0 | $V_{R2}$ |

Figure 3B:
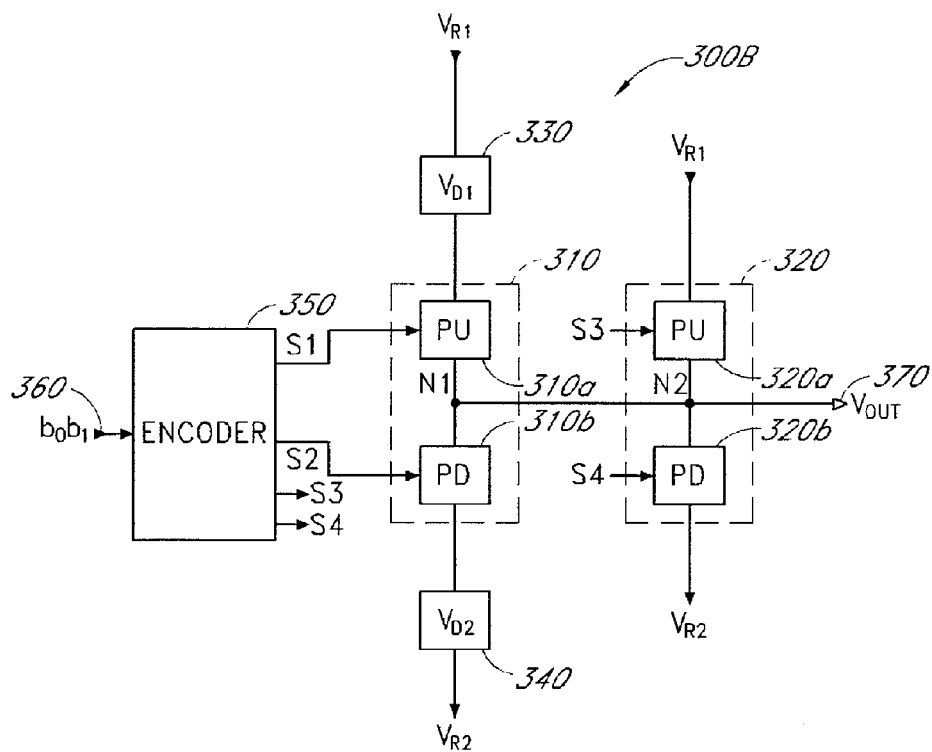
FIG. 3B is a block diagram of a transmitter circuit for generating a four-level signal according to another embodiment.

Referring to FIG. 3B, another embodiment of a transmitter circuit for multi-level signaling will now be described. The configuration of the illustrated transmitter circuit 300B is the same as that of the transmitter circuit 300A of FIG. 3A except that the encoder 350 provides four control signals S1-S4, instead of three control signals S1-S3.

In this embodiment, a first control signal S1 is provided to the first pull-up transistor 310a while a second control signal S2 is provided to the first pull-down transistor 310b. A third control signal S3 and a fourth control signal S4 are provided to the second pull-up and pull-down transistors 320a, 320b, respectively. A skilled artisan will appreciate that the encoder 350 may generate any suitable combinations of control signals for performing the same function as the transmitter circuit 300A of FIG. 3A.

Figure 4:
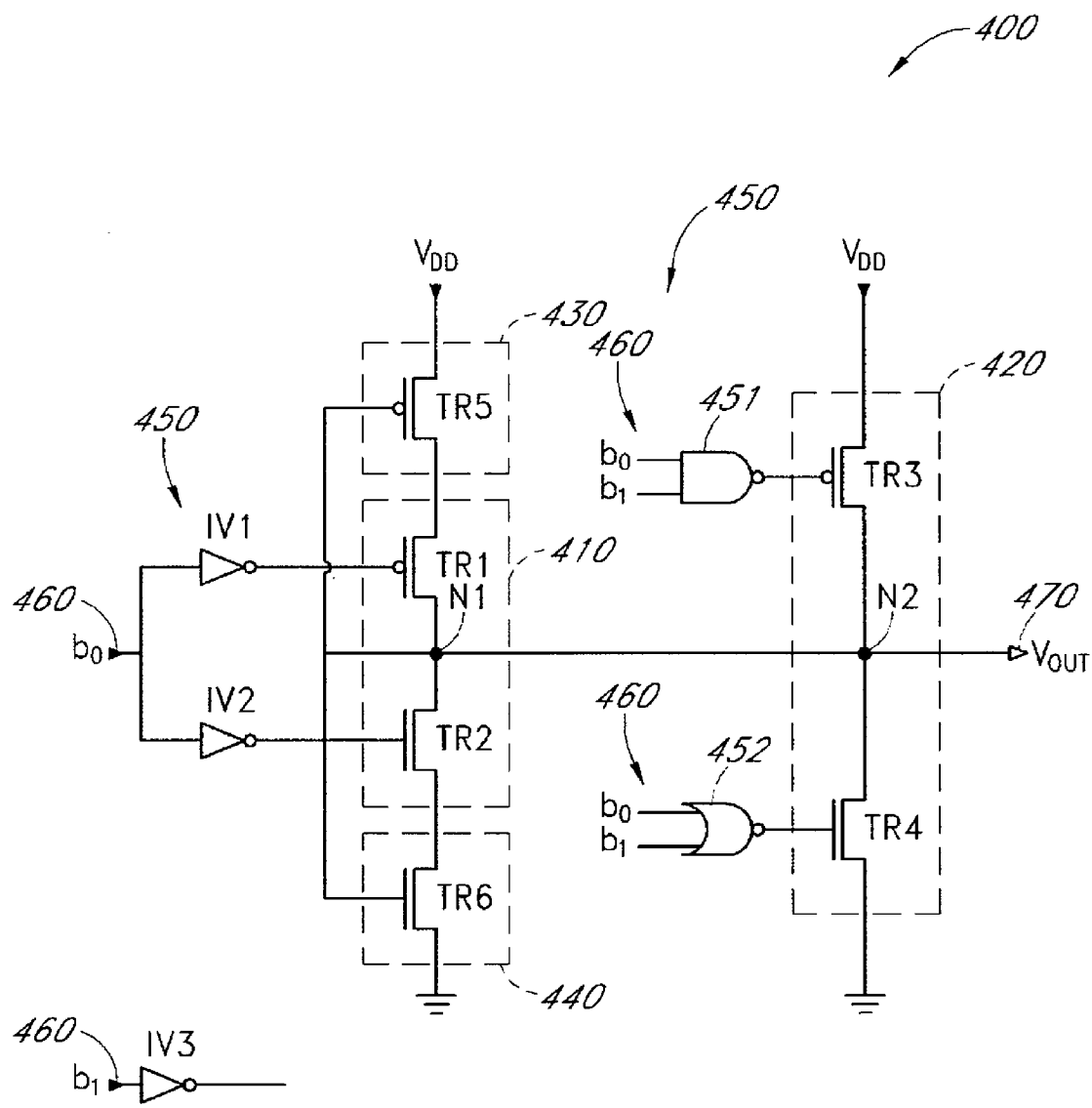
FIG. 4 is a circuit diagram of a transmitter circuit for generating a four-level signal according to one embodiment.

Referring to FIG. 4, a circuit diagram of a transmitter circuit for multi-level signaling according to one embodiment will now be described. The illustrated transmitter circuit 400 is configured to generate a four level voltage signal, i.e., a 4-PAM signal, based on two binary digits $b_0$ and $b_1$. The transmitter circuit 400 includes a first set of switches 410, a second set of switches 420, a first voltage drop circuit 430, and a second voltage drop circuit 440, an encoder 450, a data input 460 and a signal output 470. The electrical connection among the foregoing components can be described as above with respect to the circuit 300A of FIG. 3A.

Figure 11:
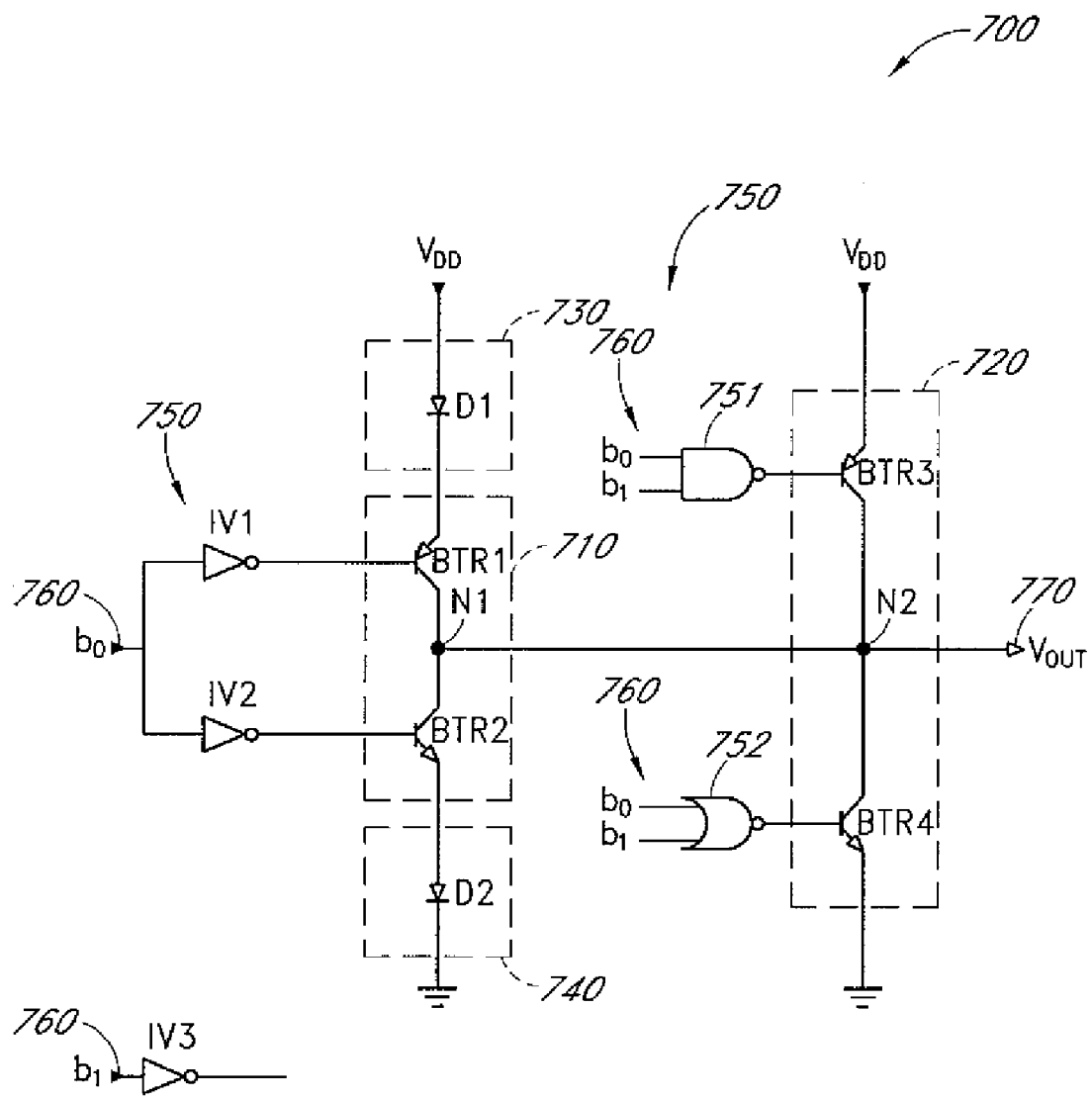
FIG. 11 is a circuit diagram of a transmitter circuit for generating a four-level signal according to another embodiment.

The first set of switches 410 may include a first transistor TR1 of a first type, and a second transistor TR2 of a second type opposite from the first type. In the illustrated embodiment, the first transistor TR1 is a p-type MOS transistor, and the second transistor TR2 is an n-type MOS transistor. In another embodiment, the first transistor TR1 may be an n-type MOS transistor, and the second transistor TR2 may be a p-type MOS transistor. In other embodiments, the first and second transistors TR1, TR2 may be replaced with bipolar transistors (see BTR1 and BTR2 in FIG. 11) or other field effect transistors of opposite types.

Each of the first and second transistors TR1, TR2 has a source/drain, a gate, and a drain/source. The drain/source of the first transistor TR1 and the drain/source of the second transistor TR2 are electrically connected to a first node N1, which is electrically connected to the signal output 470.

The second set of switches 412 may include a third transistor TR3 of the first type, and a fourth transistor TR4 of the second type opposite from the first type. In the illustrated embodiment, the third transistor TR3 is a p-type MOS transistor, and the fourth transistor TR4 is an n-type MOS transistor. In other embodiments, the third and fourth transistors TR3, TR4 may be replaced with bipolar transistors (see BTR3 and BTR4 in FIG. 11) or other field effect transistors of opposite types.

Each of the third and fourth transistors TR3, TR4 has a source/drain, a gate, and a drain/source. The drain/source of the third transistor TR3 and the drain/source of the fourth transistor TR4 are electrically connected to a second node N2, which is electrically connected to the signal output 470 and the first node N1. The drain/source of the third transistor TR3 is electrically connected to a voltage source $V_{DD}$. The source/drain of the fourth transistor TR4 is electrically connected to ground.

The first voltage drop circuit 430 and the second voltage drop circuit 440 may include a fifth transistor TR5 and a sixth transistor TR6, respectively. In the illustrated embodiment, the fifth transistor TR5 is a p-type MOS transistor and the sixth transistor TR6 is an n-type MOS transistor. In another embodiment, the fifth transistor TR5 may be an n-type MOS transistor, and the sixth transistor TR6 may be a p-type MOS transistor.

Each of the fifth and sixth transistors TR5, TR6 has a source/drain, a gate, and a drain/source. The source/drain of the fifth transistor TR5 is electrically connected to the voltage source $V_{DD}$, and the drain/source of the fifth transistor TR5 is electrically connected to the source/drain of the first transistor TR1. The drain/source of the sixth transistor TR6 is electrically connected to the source/drain of the second transistor TR2, and the source/drain of the sixth transistor TR6 is electrically connected to ground.

The gates of the fifth and sixth transistors TR5, TR6 are electrically connected to the first node N1. Thus, the fifth and sixth transistors TR5, TR6 form diode-connected transistors, functioning as diodes during the operation of the transmitter circuit 400. In other embodiments, each of the first and second voltage drop circuits 430, 440 may include two or more diode-connected transistors connected in series.

The encoder 450 includes a first inverter IV1, a second inverter IV2, a NAND gate 451, and a NOR gate 452. The first and second inverters IV1, IV2 receive a first bit $b_0$ of two-bit electronic data $b_0$ $b_1$, and invert the first bit. The first and second inverters IV1, IV2 provide the inverted first bit b0 to the gates of the first and second transistors TR1, TR2. In certain embodiments, the transmitter circuit 400 may further include another inverter IV3 to receive a second bit $b_1$ of the electronic data $b_0$ $b_1$ for equalizing the loading on the output of the previous stage. Additional logic may be used for providing tri-state-ability for the transmitter circuit 400.

The NAND gate 451 receives the first and second bits $b_0$, $b_1$ of the two-bit electronic date $b_0$ $b_1$, and performs a NAND operation on the bits $b_0$ and $b_1$. The NAND gate 451 provides an output to the gate of the third transistor TR3. The NOR gate 452 receives the first and second bits $b_0$, $b_1$ of the two-bit electronic date $b_0 b_1$, and performs a NOR operation on the bits $b_0$ and $b_1$. The NOR gate 452 provides an output to the gate of the fourth transistor TR4.

Figure 5:
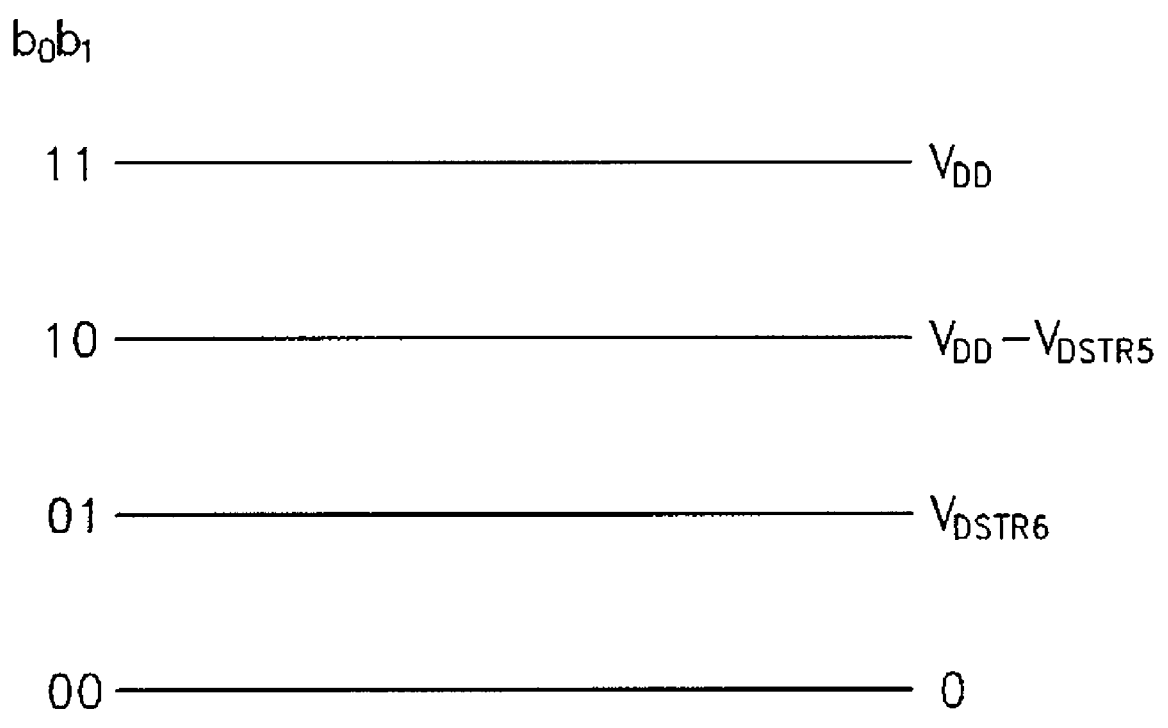

The operation of the transistors TR1-TR4 and the resulting voltage levels at the output 470 depending on the first and second bits $b_0$, $b_1$ are shown in Table 2. In Table 2, $V_{DSTR5}$ represents the drain-source voltage of the fifth transistor TR5. $V_{DSTR6}$ represents the drain-source voltage of the sixth transistor TR6. In addition, the four voltage levels generated by the transmitter circuit 400 are illustrated in FIG. 5.

TABLE 2

| $b_0$ | $b_1$ | TR1 | TR2 | TR3 | TR4 | $V_{OUT}$ |
|---|---|---|---|---|---|---|
| 1 | 1 | ON | OFF | ON | OFF | $V_{DD}$ |
| 1 | 0 | ON | OFF | OFF | OFF | $V_{DD} - V_{DSTR5}$ |
| 0 | 1 | OFF | ON | OFF | OFF | $V_{DSTR6}$ |
| 0 | 0 | OFF | ON | OFF | ON | 0 |

In Table 2 and in other embodiments described below, the $V_{OUT}$ levels are those that can be obtained when the transistors (e.g., the transistors TR1-TR4) act as ideal switches. In reality, the transistors may generate small additional voltage drops that produce minor differences in the $V_{OUT}$ levels.

Figure 1:
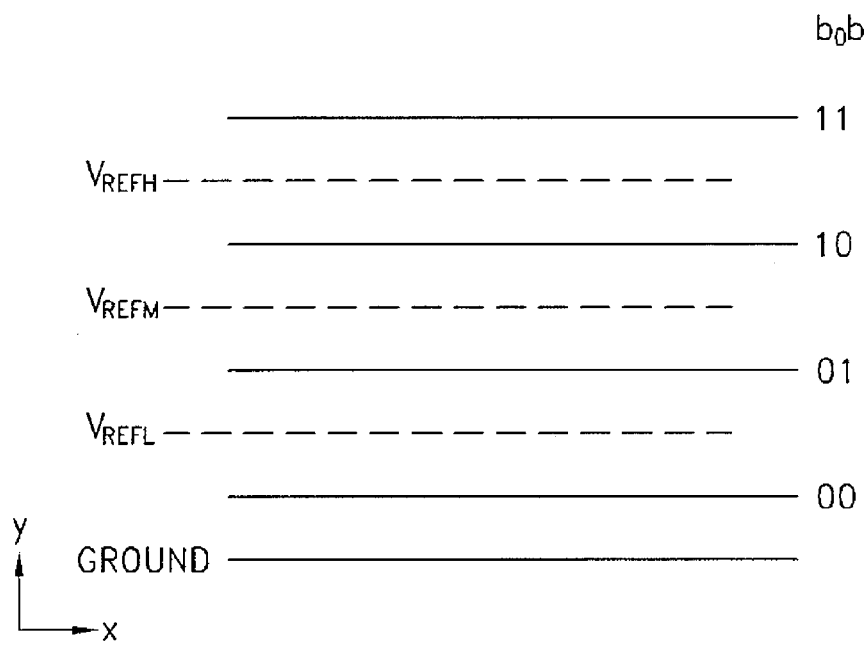
FIG. 1 is a graph illustrating a conventional multi-level signaling scheme.
Figure 2:
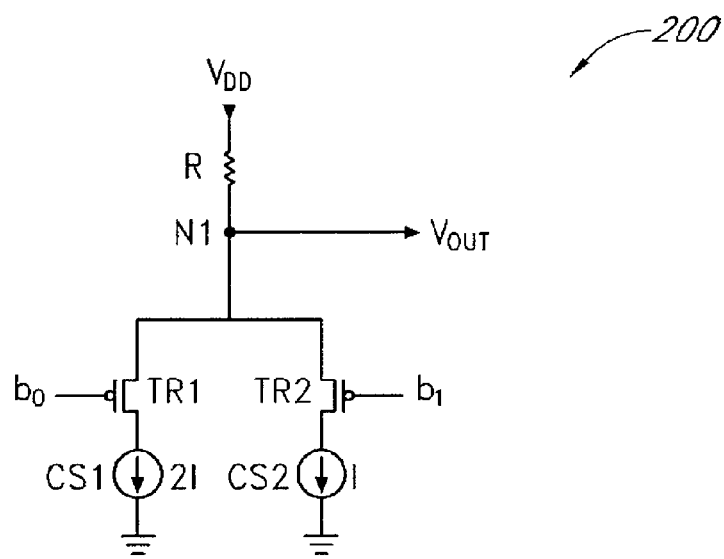
FIG. 2 is a circuit diagram of a conventional transmitter circuit for generating a four-level voltage signal.

During the operation of the transmitter circuit 400, power is dissipated only during transitions of electronic data. Thus, the power dissipation depends on the frequency of the data transmission. For example, at a data transmission frequency of about 1 Gb/s, the average power dissipated by the circuit of FIG. 4 may be about nine times less than the average power dissipated by the circuit of FIG. 2, which was described as dissipating power based on the signal level for three out of the four possible levels.

Figure 6:
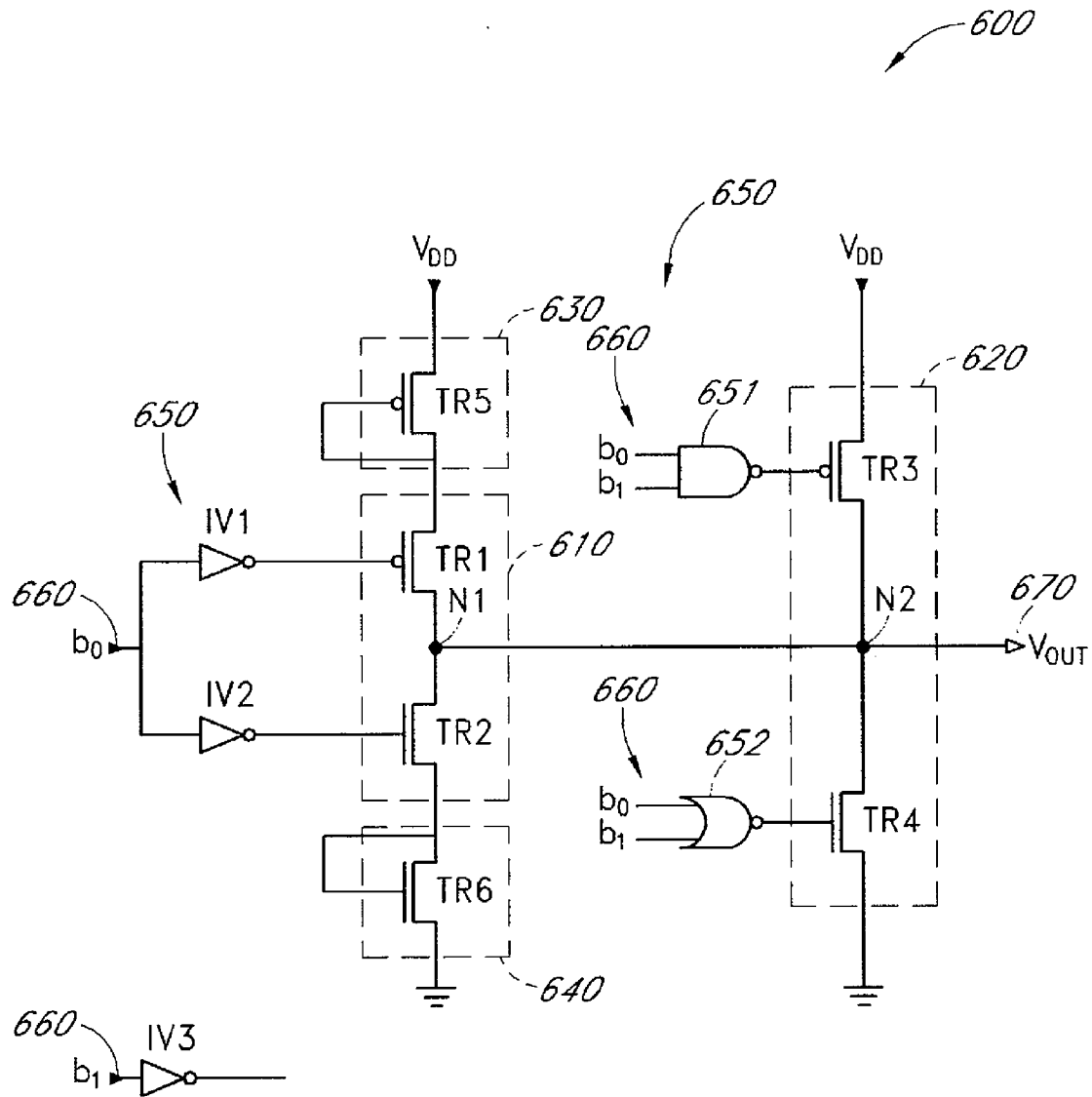
FIG. 6 is a circuit diagram of a transmitter circuit for generating a four-level signal according to another embodiment.

Referring to FIG. 6, another embodiment of a transmitter circuit for multi-level signaling will now be described. The illustrated transmitter circuit 600 is configured to generate a four level voltage signal, i.e., a 4-PAM signal, based on two binary digits b0, b1. The transmitter circuit 600 includes a first set of switches 610, a second set of switches 620, a first voltage drop circuit 630, and a second voltage drop circuit 640, an encoder 650, a data input 660 and a signal output 670. The electrical connection among the foregoing components can be described above with respect to the circuit 300A of FIG. 3A. In addition, the configurations of the components are the same as those of the components of the circuit 400 of FIG. 4 except for the first and second voltage drop circuits 630, 640.

In the illustrated embodiment, the first voltage drop circuit 630 includes a diode-connected fifth transistor TR5. The gate of the fifth transistor TR5 is connected to the source/drain of the first transistor TR1. The second voltage drop circuit 640 includes a diode-connected sixth transistor TR6. The gate of the sixth transistor TR6 is connected to the drain/source of the second transistor TR2.

The operation of the transistors TR1-TR4 and the resulting voltage levels at the output 670 depending on the first and second bits $b_0$, $b_1$ are shown in Table 3. In Table 3, $V_{DSTR5}$ represents the drain-source voltage of the fifth transistor TR5. $V_{DSTR6}$ represents the drain-source voltage of the sixth transistor TR6.

TABLE 3

| $b_0$ | $b_1$ | TR1 | TR2 | TR3 | TR4 | $V_{OUT}$ |
|---|---|---|---|---|---|---|
| 1 | 1 | ON | OFF | ON | OFF | $V_{DD}$ |
| 1 | 0 | ON | OFF | OFF | OFF | $V_{DD} - V_{DSTR5}$ |
| 0 | 1 | OFF | ON | OFF | OFF | $V_{DSTR6}$ |
| 0 | 0 | OFF | ON | OFF | ON | 0 |

Figure 7:
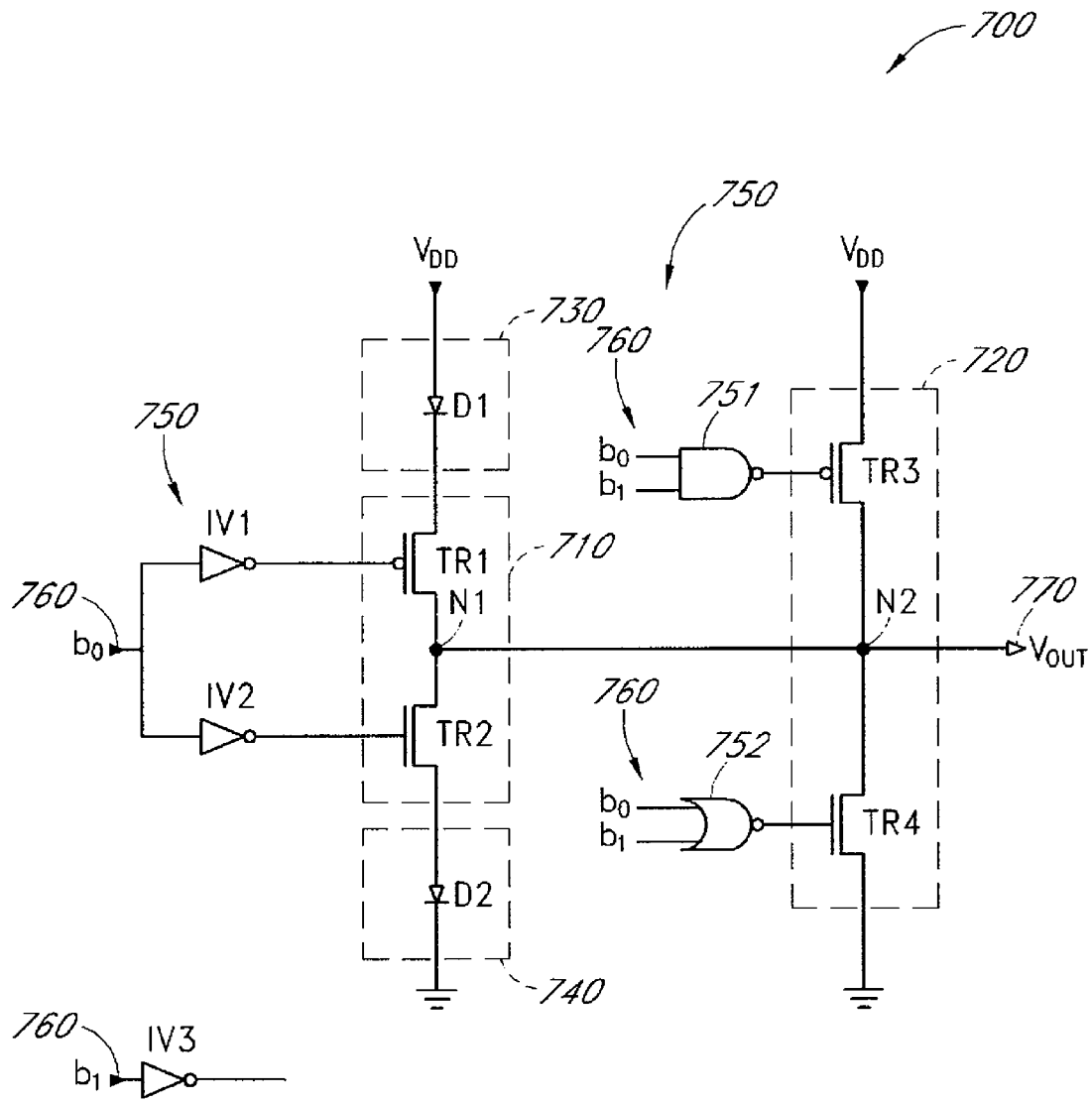
FIG. 7 is a circuit diagram of a transmitter circuit for generating a four-level signal according to yet another embodiment.

Referring to FIG. 7, another embodiment of a transmitter circuit for multi-level signaling will now be described. The illustrated transmitter circuit 700 is configured to generate a four level voltage signal, i.e., a 4-PAM signal, based on two binary digits $b_0$, $b_1$. The transmitter circuit 700 includes a first set of switches 710, a second set of switches 720, a first voltage drop circuit 730, and a second voltage drop circuit 740, an encoder 750, a data input 760 and a signal output 770. The electrical connection among the foregoing components can be described above with respect to the circuit 300A of FIG. 3A. In the illustrated embodiment, the configurations of the components are the same as those of the components of the circuit 400 of FIG. 4 except for the first and second voltage drop circuits 730, 740.

In the illustrated embodiment, each of the first and second voltage drop circuits 730, 740 may include a p-n junction diode. The first voltage drop circuit 730 may include a first diode D1 configured to flow current in a direction from a voltage source $V_{DD}$ to the source/drain of the first transistor TR1. The second voltage drop circuit 740 may include a second diode D2 configured to flow current in a direction from the source/drain of the second transistor TR2 to ground.

The operation of the transistors TR1-TR4 and the resulting voltage levels at the output 770 are shown in Table 4. In Table 4, $V_{BID1}$ represents the built-in potential of the first diode D1, i.e., a potential difference formed across the first diode D1 when an equilibrium condition is reached. $V_{BID2}$ represents the built-in potential of the second diode D2.

TABLE 4

| $b_0$ | $b_1$ | TR1 | TR2 | TR3 | TR4 | $V_{OUT}$ |
|---|---|---|---|---|---|---|
| 1 | 1 | ON | OFF | ON | OFF | $V_{DD}$ |
| 1 | 0 | ON | OFF | OFF | OFF | $V_{DD} - V_{BID1}$ |
| 0 | 1 | OFF | ON | OFF | OFF | $V_{BID2}$ |
| 0 | 0 | OFF | ON | OFF | ON | 0 |

Figure 8:
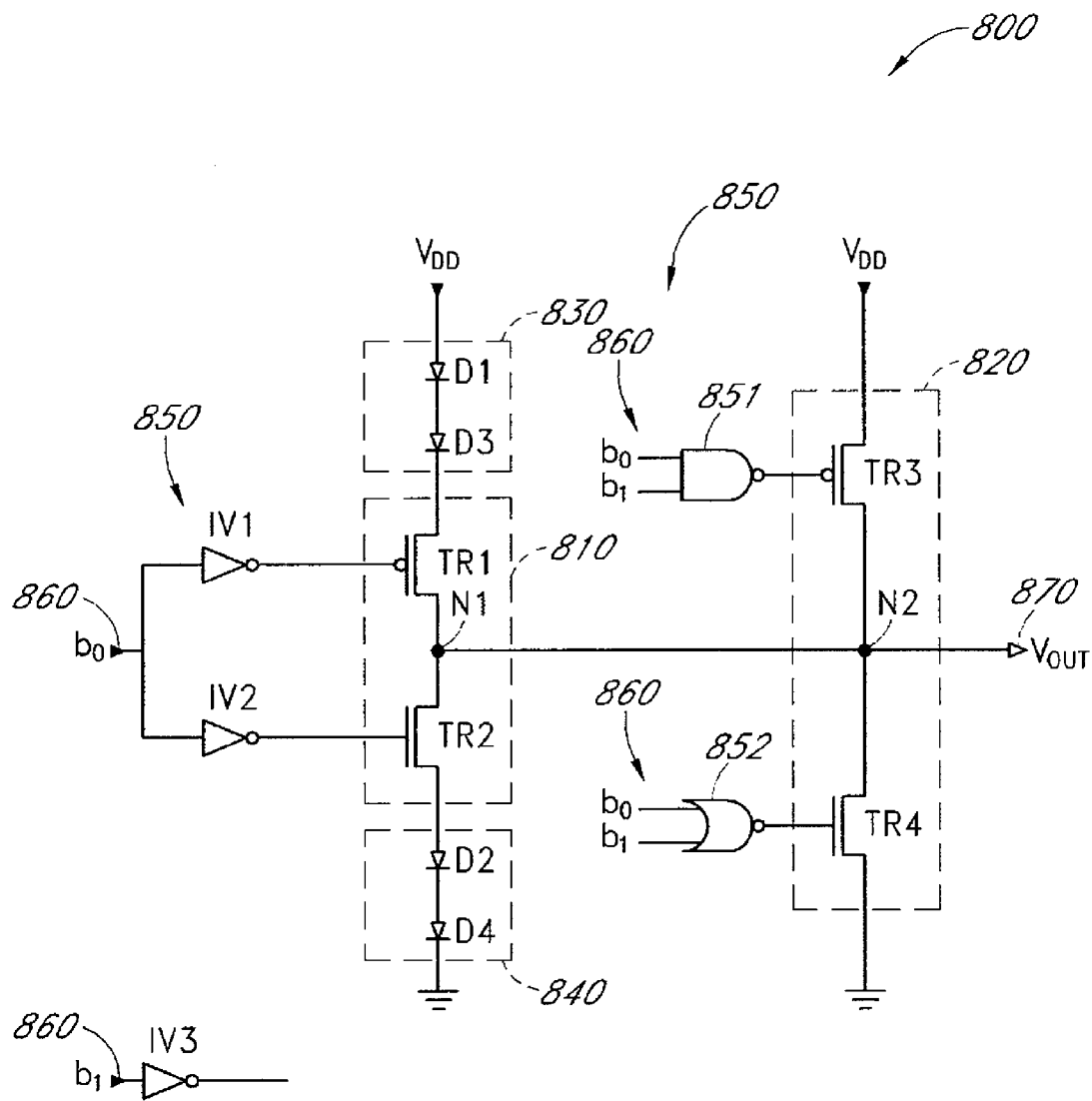
FIG. 8 is a circuit diagram of a transmitter circuit for generating a four-level signal according to yet another embodiment.

Referring to FIG. 8, yet another embodiment of a transmitter circuit for multi-level signaling will now be described. The illustrated transmitter circuit 800 is configured to generate a four-level voltage signal, i.e., a 4-PAM signal, based on two binary digits $b_0$, $b_1$. The transmitter circuit 800 includes a first set of switches 810, a second set of switches 820, a first voltage drop circuit 830, and a second voltage drop circuit 840, an encoder 850, a data input 860 and a signal output 870. The electrical connection among the foregoing components can be described above with respect to the circuit 300A of FIG. 3A. In the illustrated embodiment, the configuration is the same as the circuit 400 of FIG. 4 except for the first and second voltage drop circuits 830, 840.

In the illustrated embodiment, each of the first and second voltage drop circuits 830, 840 includes two serially connected pn-junction diodes. The first voltage drop circuit 830 may include a first diode D1 and a third diode D3 configured to flow current in a direction from the voltage source $V_{DD}$ to the source/drain of the first transistor TR1. The second voltage drop circuit 840 may include a second diode D2 and a fourth diode D4 configured to flow current in a direction from the source/drain of the second transistor TR2 to ground.

The operation of the transistors TR1-TR4 and the resulting voltage levels at the signal output 870 are shown in Table 5. In Table 5, $V_{BID1}$ represents the built-in potential of the first diode D1. $V_{BID2}$ represents the built-in potential of the second diode D2. $V_{BID3}$ represents the built-in potential of the third diode D3. $V_{BID4}$ represents the built-in potential of the fourth diode D4.

TABLE 5

| $b_0$ | $b_1$ | TR1 | TR2 | TR3 | TR4 | $V_{OUT}$ |
|---|---|---|---|---|---|---|
| 1 | 1 | ON | OFF | ON | OFF | $V_{DD}$ |
| 1 | 0 | ON | OFF | OFF | OFF | $V_{DD} - V_{BID1} - V_{BID3}$ |
| 0 | 1 | OFF | ON | OFF | OFF | $V_{BID2} + V_{BID4}$ |
| 0 | 0 | OFF | ON | OFF | ON | 0 |

In other embodiments, each of the first and second voltage drop circuits may have three or more p-n junction diodes connected in series. In certain embodiments, each of the first and second voltage drop circuits may have at least one p-n junction diode and at least one diode-connected transistors connected in series. In this manner, the two middle voltage levels of the four output voltage levels in 4-PAM can be further adjusted.

Figure 9:
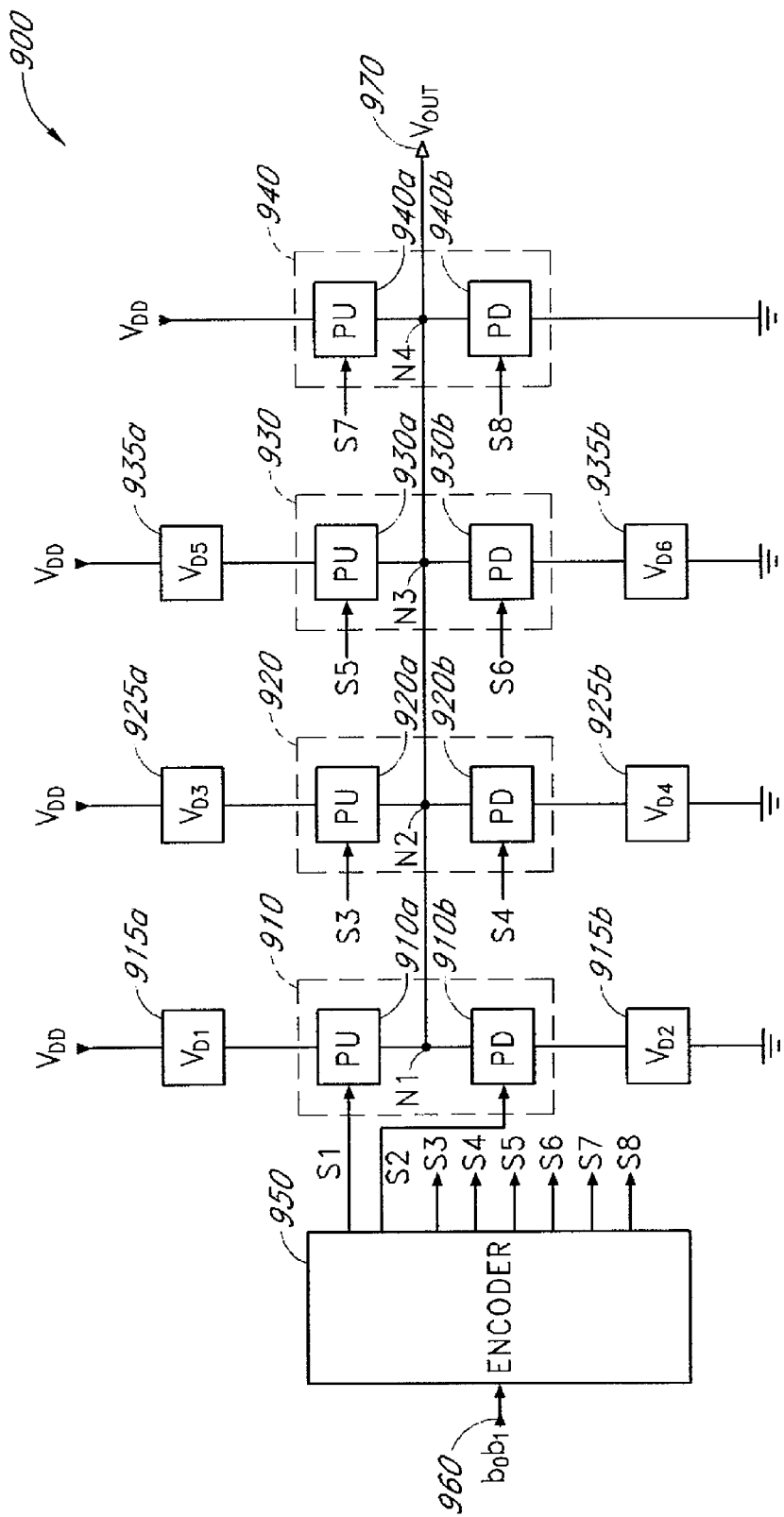
FIG. 9 is a circuit diagram of a transmitter circuit for generating an eight-level signal according to yet another embodiment.

Referring to FIG. 9, another embodiment of a transmitter circuit for multi-level signaling will now be described. The illustrated transmitter circuit 900 is configured to generate an eight-level voltage signal, i.e., an 8-PAM signal, based on three binary digits $b_0$, $b_1$, $b_2$. The transmitter circuit 900 includes a first to fourth sets of switches 910, 920, 930, 940, a first to sixth voltage drop circuits 915a, 915b, 925a, 925b, 935a, 935b, an encoder 950, a data input 960 and a signal output 970. The configuration of each of the first to fourth sets of switches 910, 920, 930, 940 can be as described above with respect to the first set of switches of FIG. 3.

The first voltage drop circuit 915a, the first set of switches 910, and the second voltage drop circuit 915b are connected between a voltage source $V_{DD}$ and ground. The first set of switches 910 may include a first pull-up transistor 910a and a first pull-down transistor 910b. A first node N1 between the first pull-up transistor 910a and the first pull-down transistor 910b is electrically connected to the signal output 970. The first voltage drop circuit 915a is connected between the voltage source $V_{DD}$ and the first pull-up transistor 910a. The second voltage drop circuit 915b is connected between the first pull-down transistor 910b and ground.

The third voltage drop circuit 925a, the second set of switches 920, and the fourth voltage drop circuit 925b are connected in order between a voltage source $V_{DD}$ and ground. The second set of switches 920 may include a second pull-up transistor 920a and a second pull-down transistor 920b. A second node N2 between the second pull-up transistor 920a and the second pull-down transistor 920b is electrically connected to the signal output 970. The third voltage drop circuit 925a is connected between the voltage source $V_{DD}$ and the second pull-up transistor 920a. The third voltage drop circuit 925b is connected between the second pull-down transistor 920b and ground.

The fifth voltage drop circuit 935a, the third set of switches 930, and the sixth voltage drop circuit 935b are connected in order between a voltage source $V_{DD}$ and ground. The third set of switches 930 may include a third pull-up transistor 930a and a third pull-down transistor 930b. A third node N3 between the third pull-up transistor 930a and the third pull-down transistor 930b is electrically connected to the signal output 970. The fifth voltage drop circuit 935a is connected between the voltage source $V_{DD}$ and the third pull-up transistor 930a. The sixth voltage drop circuit 935b is connected between the third pull-down transistor 930b and ground.

The fourth set of switches 920 is connected between the voltage source $V_{DD}$ and ground. The fourth set of switches 920 may include a fourth pull-up transistor 940a and a fourth pull-down transistor 940b. A fourth node N4 between the fourth pull-up transistor 940a and the fourth pull-down transistor 940b is electrically connected to the signal output 970.

In the illustrated embodiment, each of the first to sixth voltage drop circuits 915a, 915b, 925a, 925b, 935a, 935b may include one or more diode-connected transistors connected in series. In other embodiments, each of the first to sixth voltage drop circuits 915a, 915b, 925a, 925b, 935a, 935b may include one or more pn-junction diodes connected in series. The sizes of the first to sixth voltage drop circuits 915a, 915b, 925a, 925b, 935a, 935b can be selected so as to provide six middle ones of eight voltage levels, as described below. In certain embodiments, each of the first to sixth voltage drop circuits 915a, 915b, 925a, 925b, 935a, 935b may include one or more diode-connected transistors and one or more pn-junction diodes connected in series.

The encoder 950 receives electronic data from the data input 960, and converts it into control signals S1-S8 for selectively switching on/off components of the first to fourth set of switches 910, 920, 930, 940, as described below in Table 6. In the illustrated embodiment, the encoder 950 generates control signals from three bits $b_0$, $b_1$, and $b_2$ of electronic data.

Figure 10:
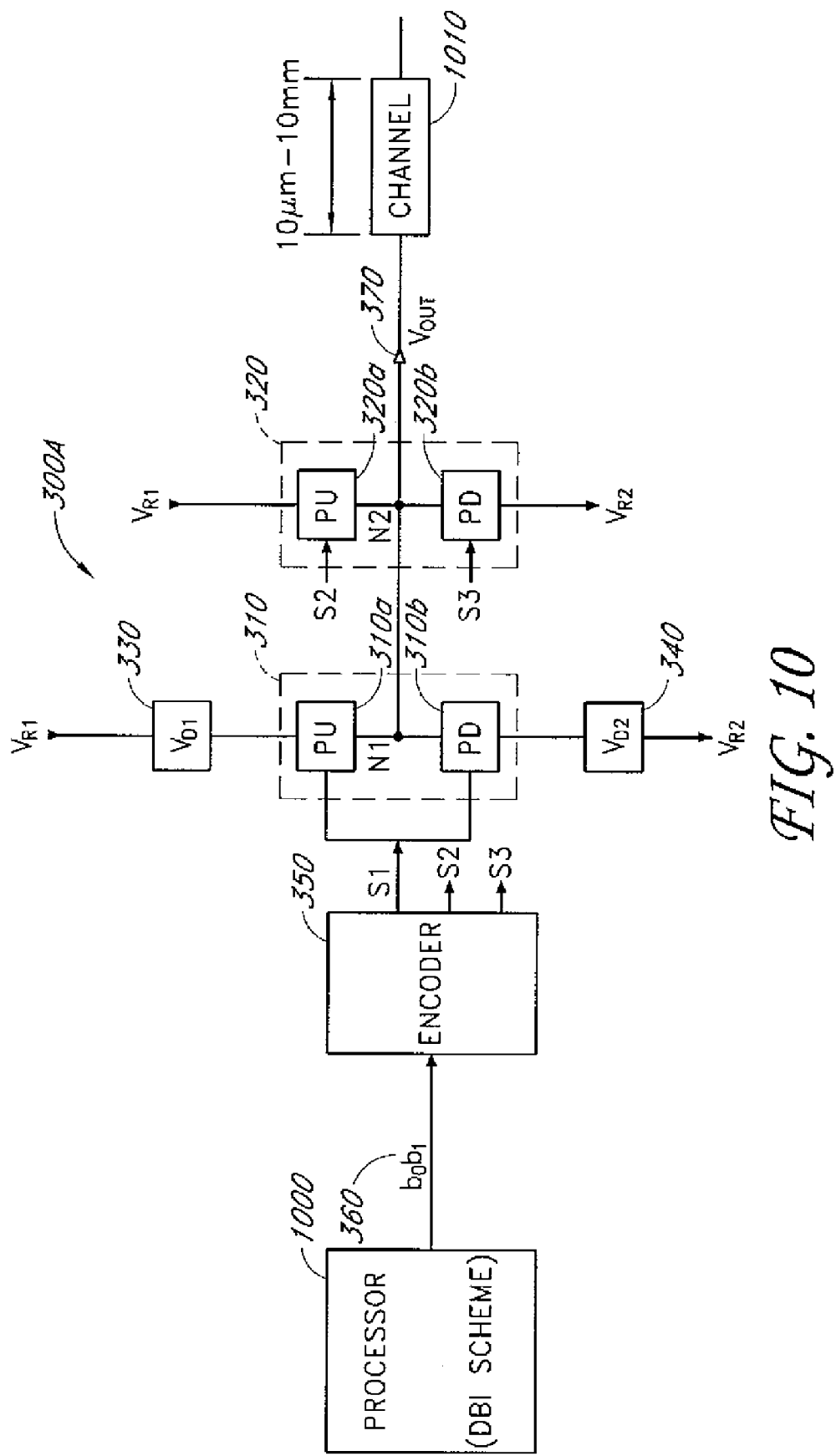
FIG. 10 is a block diagram of a transmitter circuit for generating a four-level signal according to another embodiment.

During operation, the transmitter circuit 900 may generate signals having one of eight voltage levels V1-V8 (V1>V2>V3>V4>V5>V6>V7>V8). In one embodiment, V1-V8 may each represent three-bits ($b_0 b_1 b_2$): 111, 110, 101, 100, 011, 110, 001 and 000, respectively. The signal levels representing the binary values are summarized in Table 6 below. In table 6, $V_{D1}$, $V_{D2}$, $V_{D3}$, $V_{D4}$, $V_{D5}$, $V_{D6}$ represent the voltage differences across the first to sixth voltage drop circuits 915a, 915b, 925a, 925b, 935a, 935b, respectively. In the illustrated embodiment, the relationships between the voltage differences can be as follows: $V_{D1}=V_{D2}$, $V_{D3}=V_{D4}$, $V_{D5}=V_{D6}$, $V_{D1}>V_{D3}>V_{D5}$. In Table 6, the numbers 910a, 910b, 920a, 920b, 930a, 930b, 940a, 940b represent the pull-up and pull down transistors in FIG. 9. A skilled artisan will appreciate that various other configurations of switching circuits can be used for providing multi-level signals in combination with voltage drop circuits, as described above.

vide the transmitter circuit with the processed data digits. Other details of FIG. 10 are the same as those of FIG. 3A. This configuration may further lower power consumption while improving signal integrity.

In the embodiments described above, power is dissipated only during the transitioning of electronic data. Thus, power consumption can be effectively reduced.

The transmitter circuits of the embodiments described above can have various applications. For example, the transmitter circuit can be used for short channel applications (e.g., a channel 1010 having a length of about 100μm to about 10 mm, as shown in FIG. 10), where signal losses and noise are minimal such that a voltage swing can be substantially reduced to, for example, as little as one third of the available rail-to-rail voltage. In one embodiment, an electronic device including multiple integrated circuit (IC) dies stacked over one another may have short channels between the IC dies. The transmitter circuits of the embodiments described above may be formed in one or more of the IC dies for data transmission.

In addition, the transmitter circuits of the embodiments described above can be adapted for various electronic devices. Examples of the electronic devices can include, but are not limited to, consumer electronic products, electronic circuits, electronic circuit components, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

In one embodiment, an apparatus includes a first switch coupled to a first voltage reference and to an output node. The first switch is configured to conduct the first voltage reference to the output node when activated and to be an open circuit when deactivated. The apparatus also includes a second switch coupled to a second voltage reference and to the output node. The second switch is configured to conduct the second voltage reference to the output node when activated and to be

TABLE 6

| $b_0$ | $b_1$ | $b_2$ | 910a | 910b | 920a | 920b | 930a | 930b | 940a | 940b | $V_{OUT}$ |
|---|---|---|---|---|---|---|---|---|---|---|---|
| 1 | 1 | 1 | OFF | OFF | OFF | OFF | OFF | OFF | ON | OFF | $V_{DD}$ |
| 1 | 1 | 0 | OFF | OFF | OFF | OFF | ON | OFF | OFF | OFF | $V_{DD} - V_{D5}$ |
| 1 | 0 | 1 | OFF | OFF | ON | OFF | OFF | OFF | OFF | OFF | $V_{DD} - V_{D3}$ |
| 1 | 0 | 0 | ON | OFF | OFF | OFF | OFF | OFF | OFF | OFF | $V_{DD} - V_{D1}$ |
| 0 | 1 | 1 | OFF | ON | OFF | OFF | OFF | OFF | OFF | OFF | $V_{D2}$ |
| 0 | 1 | 0 | OFF | OFF | OFF | ON | OFF | OFF | OFF | OFF | $V_{D4}$ |
| 0 | 0 | 1 | OFF | OFF | OFF | OFF | OFF | ON | OFF | OFF | $V_{D6}$ |
| 0 | 0 | 0 | OFF | OFF | OFF | OFF | OFF | OFF | OFF | ON | 0 |

In certain embodiments, the embodiments described above may be combined with data bus inversion (DBI) schemes. DBI schemes typically favor one binary state over another. A DBI scheme suitable for lowering the number of transitions over time can be combined with any one of the transmitter circuits of the embodiments described above. In one embodiment, as shown in FIG. 10, a processor 1000 may be used to process data digits using such a DBI scheme, and may proan open circuit when deactivated, wherein the second voltage reference has voltage lower than the first voltage reference. The apparatus further includes a first voltage drop circuit coupled to the first voltage reference. The first voltage drop circuit is configured to generate a third voltage reference having voltage lower than the first voltage reference, but higher than the second voltage reference. The apparatus further includes a third switch coupled to the third voltage reference and to the output node. The third switch is configured to conduct the third voltage reference to the output node when activated and to be an open circuit when deactivated. The apparatus further includes a second voltage drop circuit coupled to the second voltage reference. The second voltage drop circuit is configured to generate a fourth voltage reference having a voltage higher than the second voltage reference, but lower than the third voltage reference. The apparatus also includes a fourth switch coupled to the fourth voltage reference and to the output node. The fourth switch is configured to conduct the fourth voltage reference to the output node when activated and to be an open circuit when deactivated. The apparatus also includes an encoder configured to activate at least one of the first switch, the second switch, the third switch, or the fourth switch at least partially in response to input data for the encoder for generation of a multi-level output signal at the output node.

In another embodiment, an apparatus includes a first voltage reference; a second voltage reference lower in voltage than the first voltage reference; and a plurality of voltage drop circuits. Each of the voltage drop circuits is coupled to the first or second voltage reference. Each of the voltage drop circuit is configured to generate a plurality of middle voltage references having voltage levels different from one another. Each of the middle voltage references has voltage lower than the first voltage reference, but higher than the second voltage reference. The apparatus also includes a plurality of switches, each of the switches being coupled to the first voltage reference, the second voltage reference, or one of the middle voltage references and to an output node. Each of the switches is configured to conduct the first voltage reference, the second voltage reference, or one of the middle voltage references to the output node when activated and to be an open circuit when deactivated. The apparatus further includes an encoder configured to activate at least one of the switches at least partially in response to input data for the encoder for generation of a multi-level output signal at the output node.

In yet another embodiment, a method of generating a multi-level output signal for an output node is provided. The method includes: receiving input data; receiving a first voltage reference and a second voltage reference. The second voltage reference is lower in voltage than the first voltage reference. The method also includes generating a third voltage reference, wherein the third voltage reference is lower in voltage than the first voltage reference but higher in voltage than the second voltage reference, and generating a fourth voltage reference, wherein the fourth voltage is lower in voltage than the third voltage reference, but higher in voltage than the second voltage reference. The method further includes coupling the output node to one of the first voltage reference, the second voltage reference, the third voltage reference, or the fourth voltage reference at least partially in response to the received input data for generation of the multi-level output signal for the output node.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

I claim:

1. An apparatus comprising:
a first switch coupled to a first voltage reference and to an output node, the first switch being configured to conduct the first voltage reference to the output node when activated and to be an open circuit when deactivated;
a second switch coupled to a second voltage reference and to the output node, the second switch being configured to conduct the second voltage reference to the output node when activated and to be an open circuit when deactivated, wherein the second voltage reference has voltage lower than the first voltage reference;
a first voltage drop circuit coupled to the first voltage reference, the first voltage drop circuit being configured to generate a third voltage reference having voltage lower than the first voltage reference, but higher than the second voltage reference;
a third switch coupled to the third voltage reference and to the output node, the third switch being configured to conduct the third voltage reference to the output node when activated and to be an open circuit when deactivated;
a second voltage drop circuit coupled to the second voltage reference, the second voltage drop circuit being configured to generate a fourth voltage reference having a voltage higher than the second voltage reference, but lower than the third voltage reference;
a fourth switch coupled to the fourth voltage reference and to the output node, the fourth switch being configured to conduct the fourth voltage reference to the output node when activated and to be an open circuit when deactivated; and
an encoder configured to activate at least one of the first switch, the second switch, the third switch, or the fourth switch at least partially in response to input data for the encoder for generation of a multi-level output signal at the output node, wherein the encoder is further configured to provide first, second, and third control signals to the first, second, and third switches, respectively.

2. The apparatus of claim 1, wherein the first voltage reference is provided by a voltage source and the second voltage reference is ground.

3. The apparatus of claim 1, wherein each of the first to fourth switches comprises a bipolar transistor.

4. The apparatus of claim 1, wherein each of the first to fourth switches comprises a field-effect transistor.

5. The apparatus of claim 4, wherein each of the first and third switches comprises a field-effect transistor of a first type, and wherein each of the second and fourth switches comprises a field-effect transistor of a second type different from the first type.

6. The apparatus of claim 5, wherein the first type is p-type and the second type is n-type.

7. The apparatus of claim 5, wherein each of the first to fourth switches includes a gate configured to receive a control signal from the encoder.

8. The apparatus of claim 7, wherein the input data comprises a plurality of data digits, and wherein the encoder comprises one or more inverters configured to receive one or more of the plurality of data digits and to provide one or more control signals to the gates of the third and fourth switches.

9. The apparatus of claim 8, wherein the encoder further comprises a NAND gate configured to receive two or more of the plurality of data digits and to provide an output to the gate of the first switch.

10. The apparatus of claim 8, wherein the encoder further comprises a NOR gate configured to receive two or more of the plurality of data digits and to provide an output to the gate of the second switch.

11. The apparatus of claim 1, further comprising a processor configured to process the plurality of data digits using a data bus inversion (DBI) scheme to lower the number of transitions of the data digits over time, wherein the processor is configured to provide the encoder with the processed data digits.

12. The apparatus of claim 1, wherein each of the first and second voltage drop circuits comprises one or more diode-connected transistors connected in series with one another.

13. The apparatus of claim 12, wherein each of the one or more diode-connected transistors comprises a gate or a base electrically connected to the output node.

14. The apparatus of claim 1, wherein each of the first and second voltage drop circuits comprises one or more pn-junction diodes connected in series to one another.

15. The apparatus of claim 1, wherein the multi-level output signal is a four-level signal.

16. An apparatus comprising:
a first switch coupled to a first voltage reference and to an output node, the first switch being configured to conduct the first voltage reference to the output node when activated and to be an open circuit when deactivated;
a second switch coupled to a second voltage reference and to the output node, the second switch being configured to conduct the second voltage reference to the output node when activated and to be an open circuit when deactivated, wherein the second voltage reference has voltage lower than the first voltage reference;
a first voltage drop circuit coupled to the first voltage reference, the first voltage drop circuit being configured to generate a third voltage reference having voltage lower than the first voltage reference, but higher than the second voltage reference;
a third switch coupled to the third voltage reference and to the output node, the third switch being configured to conduct the third voltage reference to the output node when activated and to be an open circuit when deactivated;
a second voltage drop circuit coupled to the second voltage reference, the second voltage drop circuit being configured to generate a fourth voltage reference having a voltage higher than the second voltage reference, but lower than the third voltage reference;
a fourth switch coupled to the fourth voltage reference and to the output node, the fourth switch being configured to conduct the fourth voltage reference to the output node when activated and to be an open circuit when deactivated; and
an encoder configured to activate at least one of the first switch, the second switch, the third switch, or the fourth switch at least partially in response to input data for the encoder for generation of a multi-level output signal at the output node,
wherein the multi-level output signal is an eight-level signal.

17. The apparatus of claim 1, further comprising a channel having a length between about 100 μm to about 10 mm, wherein the output node is electrically connected to the channel.

18. An apparatus, comprising:
a first voltage reference;
a second voltage reference lower in voltage than the first voltage reference;
a plurality of voltage drop circuits, each of the voltage drop circuits being coupled to the first or second voltage reference, the voltage drop circuits being configured to generate a plurality of middle voltage references having voltage levels different from one another, each of the middle voltage references having voltage lower than the first voltage reference, but higher than the second voltage reference;
a plurality of switches, each of the switches being coupled to the first voltage reference, the second voltage reference, or one of the middle voltage references and to an output node, wherein each of the switches is configured to conduct the first voltage reference, the second voltage reference, or one of the middle voltage references to the output node when activated and to be an open circuit when deactivated; and
an encoder configured to activate at least one of the switches at least partially in response to input data for the encoder for generation of a multi-level output signal having at least four levels at the output node.

19. The apparatus of claim 18, wherein the plurality of voltage drop circuits comprises:
a first voltage drop circuit coupled to the first voltage reference, the first voltage drop circuit being configured to generate a third voltage reference having voltage lower than the first voltage reference, but higher than the second voltage reference; and
a second voltage drop circuit coupled to the second voltage reference, the second voltage drop circuit being configured to generate a fourth voltage reference having voltage higher than the second voltage reference, but lower than the third voltage reference.

20. An apparatus, comprising:
a first voltage reference;
a second voltage reference lower in voltage than the first voltage reference;
a plurality of voltage drop circuits, each of the voltage drop circuits being coupled to the first or second voltage reference, each of the voltage drop circuit being configured to generate a plurality of middle voltage references having voltage levels different from one another, each of the middle voltage references having voltage lower than the first voltage reference, but higher than the second voltage reference;
a plurality of switches, each of the switches being coupled to the first voltage reference, the second voltage reference, or one of the middle voltage references and to an output node, wherein each of the switches is configured to conduct the first voltage reference, the second voltage reference, or one of the middle voltage references to the output node when activated and to be an open circuit when deactivated; and
an encoder configured to activate at least one of the switches at least partially in response to input data for the encoder for generation of a multi-level output signal at the output node,
wherein the plurality of voltage drop circuits comprises:
a first voltage drop circuit coupled to the first voltage reference, the first voltage drop circuit being configured to generate a third voltage reference having voltage lower than the first voltage reference, but higher than the second voltage reference; and
a second voltage drop circuit coupled to the second voltage reference, the second voltage drop circuit being configured to generate a fourth voltage reference having voltage higher than the second voltage reference, but lower than the third voltage reference, wherein the plurality of voltage drop circuits further comprises:
a third voltage drop circuit coupled to the first voltage reference, the third voltage drop circuit being configured to generate a fifth voltage reference having voltage lower than the third voltage reference, but higher than the fourth voltage reference; and
a fourth voltage drop circuit coupled to the second voltage reference, the fourth voltage drop circuit being configured to generate a sixth voltage reference having voltage higher than the fourth voltage reference, but lower than the fifth voltage reference.

21. The apparatus of claim 20, wherein the plurality of voltage drop circuits further comprises:
a fifth voltage drop circuit coupled to the first voltage reference, the fifth voltage drop circuit being configured to generate a seventh voltage reference having voltage lower than the fifth voltage reference, but higher than the sixth voltage reference; and
a sixth voltage drop circuit coupled to the second voltage reference, the sixth voltage drop circuit being configured to generate an eighth voltage reference having voltage higher than the sixth voltage reference, but lower than the seventh voltage reference.

22. A method of generating a multi-level output signal for an output node, the method comprising:
receiving input data;
receiving a first voltage reference and a second voltage reference, the second voltage reference lower in voltage than the first voltage reference;
generating a third voltage reference, wherein the third voltage reference is lower in voltage than the first voltage reference but higher in voltage than the second voltage reference;
generating a fourth voltage reference, wherein the fourth voltage is lower in voltage than the third voltage reference, but higher in voltage than the second voltage reference; and
coupling the output node to one of the first voltage reference, the second voltage reference, the third voltage reference, or the fourth voltage reference at least partially in response to the received input data for generation of the multi-level output signal having at least four levels for the output node,
wherein generating the third voltage reference comprises decreasing a voltage level of the first voltage reference by a diode connection.

23. A method of generating a multi-level output signal for an output node, the method comprising:
receiving input data;
receiving a first voltage reference and a second voltage reference, the second voltage reference lower in voltage than the first voltage reference;
generating a third voltage reference, wherein the third voltage reference is lower in voltage than the first voltage reference but higher in voltage than the second voltage reference;
generating a fourth voltage reference, wherein the fourth voltage is lower in voltage than the third voltage reference, but higher in voltage than the second voltage reference; and
coupling the output node to one of the first voltage reference, the second voltage reference, the third voltage reference, or the fourth voltage reference at least partially in response to the received input data for generation of the multi-level output signal having at least four levels for the output node,
wherein generating the fourth voltage reference comprises increasing a voltage level of the second voltage reference by a diode connection.

24. The apparatus of claim 1, wherein the encoder is further configured to provide the third control signal to the fourth switch.

25. The apparatus of claim 1, wherein the encoder is further configured to provide a fourth control signal to the fourth switch.

* * * * *